United States Patent
Sei et al.

(10) Patent No.: US 6,542,381 B1
(45) Date of Patent: Apr. 1, 2003

(54) DEVICE AND METHOD FOR MOUNTING VIBRATOR

(75) Inventors: Junichiro Sei, Yokohama (JP); Tsukasa Kobayashi, Yokohama (JP); Makoto Noto, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/787,350

(22) PCT Filed: Jul. 18, 2000

(86) PCT No.: PCT/JP00/04818
§ 371 (c)(1),
(2), (4) Date: Mar. 16, 2001

(87) PCT Pub. No.: WO01/05521
PCT Pub. Date: Jan. 25, 2001

(30) Foreign Application Priority Data

Jul. 19, 1999 (JP) ............................................. 11-204889

(51) Int. Cl.$^7$ ............................. H05K 7/14; H02K 5/24
(52) U.S. Cl. ...................... 361/801; 361/752; 361/807; 361/800; 310/51; 310/81
(58) Field of Search ................................. 361/752, 753, 361/801, 807, 800, 816, 818; 310/51, 81, 91

(56) References Cited

U.S. PATENT DOCUMENTS 5,801,466 A * 9/1998 Odagiri et al. ................ 310/81
5,943,214 A * 8/1999 Sato et al. .................... 361/752

FOREIGN PATENT DOCUMENTS

| JP | 10-117460 | 5/1998 |
| JP | 10-136608 | 5/1998 |

* cited by examiner

Primary Examiner—Jayprakash N. Gandhi
(74) Attorney, Agent, or Firm—Pearne & Gordon LLP

(57) ABSTRACT

Vibrator attaching structure is provided in which the working efficiency at the assembly time and the disassembly time is good, the required arrangement space is made small, and a device can be miniaturized. A vibrator-attaching base (20) has at its lower portion a shield case (22) that is a box-shaped base member functioning also as a shield member on a print circuit board (10). At the upper portion of this shield case (22), a holder (26) that is a holding member is integrally formed. By forcing and fitting a vibrator (2) covered with a shock absorber (8) into the holder (26) of the vibrator attaching base (20), the vibrator (2) is held; and by attaching the shield case (22) to the print circuit board (10), a plate spring-shaped terminal (7) projectingly provided for the vibrator (2) is brought into contact with a contact portion (12) of the print circuit board (10) thereby to conduct, whereby an integral print circuit board unit in which the vibrator (2) is mounted on the print circuit board (10) is constituted.

8 Claims, 4 Drawing Sheets

DEVICE AND METHOD FOR MOUNTING VIBRATOR

TECHNICAL FIELD

The present invention relates to a vibrator holder for mounting a vibrator that vibrates a device body in an electronic device such as a communication terminal unit, and to a vibrator attaching method.

BACKGROUND ART

To a small-sized communication terminal unit, for example, a pager, a portable telephone, or the like, a vibrator is attached in order to inform a user of terminating call, by which the device body is vibrated. In this vibrator, an eccentric piece is attached to a drive shaft of a motor and vibration generated by rotating the eccentric piece by the drive shaft is transmitted to the device body.

Referring to FIGS. 3 and 4, examples of the conventional vibrator attaching structure will be described. FIGS. 3A and 3B show a first conventional example, in which in a state where a vibrator 50 is covered with a shock absorber 51, this vibrator 50 is attached to holding portions 53 and 54 of a supporting member 52, and then lead wires 55 extending from the vibrator 50 are soldered to a print circuit board 56 in which circuit parts are covered with a shield member 57, whereby the vibrator 50 is electrically connected to the print circuit board 56 and thereafter the print circuit board 56 is attached to a case 58 or the supporting member 52.

FIGS. 4A and 4B show a second conventional example, in which a vibrator 60 is attached through a shock absorber 61 to a sub-print circuit board 62 with solder, and a male connector 63a of the sub-print circuit board 62 is put in to a female connector 63b of a main print circuit board 64 in which circuit parts are covered with a shield member 65, whereby the vibrator 60 is electrically connected to the main print circuit board 64 and thereafter the main print circuit board 64 is attached to a case 67. In this example, a shock absorber 66 is provided also between the vibrator 60 and the case 67.

However, in case of the first conventional example shown in FIG. 3, the holding portions 53, 54 for holding the vibrator 50 and the shock absorber 51 are constituted separately from the print circuit board 56, and the holding force of the holding portions 53, 54 in relation to the vibrator 50 and the shock absorber 51 is firmer than the connecting force between the print circuit board 56 and the lead wires 55. For this reason, in case that the communication terminal unit is disassembled, in order to prevent the vibrator 50 from being connected by only the lead wires 56 and being in a hanging state, it must be disassembled after the solder of the lead wires 55 to the print circuit board 56 was removed, so that there was a problem that much time and labor require for the disassembly.

Further, the shield member 57 is provided above the print circuit board 56, and vacancy is formed between the vibrator 50 and the print circuit board 56 and between the shield member 57 and the case 58, whereby much arrangement space is required, so that there was a problem that the device must be made large.

Further, in case of the second conventional example shown in FIG. 4, the sub-print circuit board 62 for attaching the vibrator 60 and the shock absorber 61 thereto is required, and the connectors 63a, 63b must be arranged between the sub-print circuit board 62 and the main print circuit board 64 in order to electrically connect the vibrator 60 to the main print circuit board 64. Further, the shield member 65 is provided above the main print circuit board 64, and arrangement space for this shield member 65 and for vacancy between the shield member 65 and the sub-print circuit board 62 is required. Forth is reason, a height H from the main print circuit board 64 to the sub print circuit board 62 becomes relatively large, and the inner space of the case 67 becomes considerably wide. Therefore, there was a problem that the device must be made large similarly to in FIG. 3.

The invention has been made in view of the above circumstances, and its object is to provide a vibrator holder and a vibrator attaching method, in which working efficiency at the assembly and disassembly time is good, and the required arrangement space is small thereby to make miniaturization of the device possible.

DISCLOSURE OF THE INVENTION

A vibrator holder according to the invention is characterized in that:

(1) There are provided a holding member for fitting and holding a vibrator therein, and a base member which, when attached onto a circuit board, forms a gap between it and the circuit board, the aforesaid holding member and base member are integrally formed, and the aforesaid vibrator is fitted into the afore said holding member, where by a terminal of this vibrator conducts to the aforesaid circuit board.

(2) The aforesaid base member is composed of a box-shaped member, and inner space of this box-shaped member forms the space between the base member and the aforesaid circuit board.

(3) The aforesaid base member is composed of a box-shaped member, and this box-shaped member is used also as a shield member of the aforesaid circuit board.

(4) A plate spring-shaped terminal is projectingly provided for the aforesaid vibrator, and a contact portion that comes into contact with and conducts to the terminal of the afore said vibrator is provided for the aforesaid circuit board.

A vibrator attaching method according to the invention is characterized:

(5) A vibrator attaching base is used, which is formed by integrally forming a holding member that holds a vibrator for vibrating a case and a base member attached onto a circuit board that conducts to a terminal of this vibrator, the vibrator is fitted into and held by the aforesaid holding member, and the aforesaid base member is attached to the aforesaid circuit board and forms vacancy between it and the circuit board.

(6) The aforesaid base member is composed of a box-shaped member, and this box-shaped member is used also as a shield member of the aforesaid circuit board.

(7) A plate spring-shaped terminal is projectingly provided for the aforesaid vibrator, and a contact portion is provided for the aforesaid circuit board thereby to come into contact with and conducts to the terminal of the afore said vibrator.

An electronic device according to the invention is equipped with:

(8) a vibrator holder in which there are provided a holding member for fitting and holding a vibrator therein, and a base member which, when attached onto a circuit board, forms a gap between it and this circuit board; the a fore said holding member and base member are integrally formed; and the a fore said vibrator is fitted into the aforesaid holding member, whereby a terminal of this vibrator conducts to the aforesaid circuit board.

A communication terminal unit according to the invention is equipped with:

(9) a vibrator holder in which there are provided a holding member for fitting and holding a vibrator therein, and a base member which, when attached onto a circuit board, forms a gap between it and this circuit board; the aforesaid holding member and base member are integrally formed; and the afore said vibrator is fitted into the aforesaid holding member, whereby a terminal of this vibrator conducts to the aforesaid circuit board.

As described above, the member in which the holding member and the base member are integrally formed is used as the vibrator attaching base for attaching the vibrator; the vibrator is fitted into and attached to the holding member, for example, by forcing the vibrator coated with a shock absorber into the holding member; and the base member is attached to the circuit board to cause the circuit board to conduct to the terminal of the vibrator, whereby an integral circuit board unit in which the vibrator is mounted on the circuit board is constituted. As described above, since the vibrator is held in the circuit board, efficiency of working such as assembly and disassembly at the manufacturing time and at the maintenance time is good, so that the vibrator can be readily attached and detached.

Further, the base member is composed of the box-shaped member, and the inner space of this box-shaped member forms the space between the circuit board and the holding member, whereby the unnecessary contact and intervention of the vibrator in relation to the circuit board are prevented. Further, since the base member is composed of the box-shaped member having also the function of the shield member required in the circuit board, the number of parts is reduced and the arrangement space for attaching the vibrator is suppressed to a minimum. Further, since the plate spring-shaped terminal provided for the vibrator is brought into contact with the contact portion provided for the circuit board thereby to cause the vibrator conduct to the circuit board, working such as soldering and removing of solder at the assembly and disassembly times is not required, so that working efficiency is good, and the assembly and maintenance can be readily executed.

By applying the above vibrator holder and vibrator attaching method to an electronic device, and particularly to a communication terminal unit, the vibrator is attached to the smaller arrangement space, whereby the device can be miniaturized.

BRIEF DESCRIPTION OF THE DRAWINGS

FIG. 3 is a diagram showing a first conventional example of vibrator attaching structure, in which

FIG. 4 is a diagram showing a second conventional example of the vibrator attaching structure, in which

Figure 1:
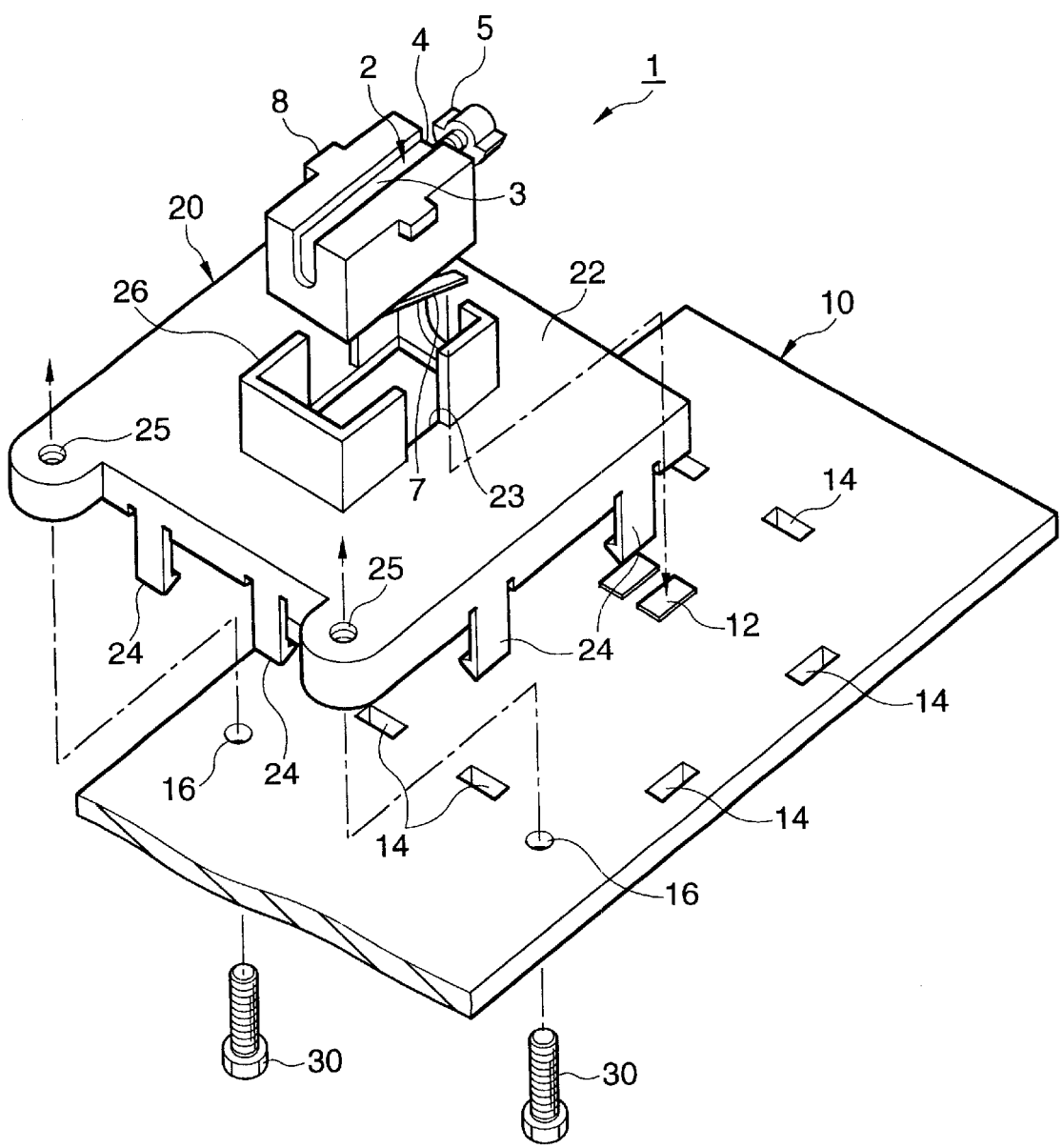
FIG. 1 is an exploded perspective view showing the constitution of a main portion of a communication terminal unit equipped with a vibrator holder according to one mode for carrying out the invention.

In the figures, reference numeral 1 is a communication terminal unit, 2 is a vibrator, 7 is a plate spring-shaped terminal, 8, 32 are shock absorbers, 10 is a print circuit board, 12 is a contact portion, 14 is a fitting hole, 16 is a through-hole, 20 is a vibrator attaching base, 21 is vacancy, 22 is a shield case, 23 is a through-hole, 24 is a fitting claw, 25 is a female screw hole, 26 is a holder, 30 is a bolt, and 33 is a case.

BEST MODE FOR CARRYING OUT THE INVENTION

A mode for carrying out the invention will be described below with reference to drawings.

Figure 2:
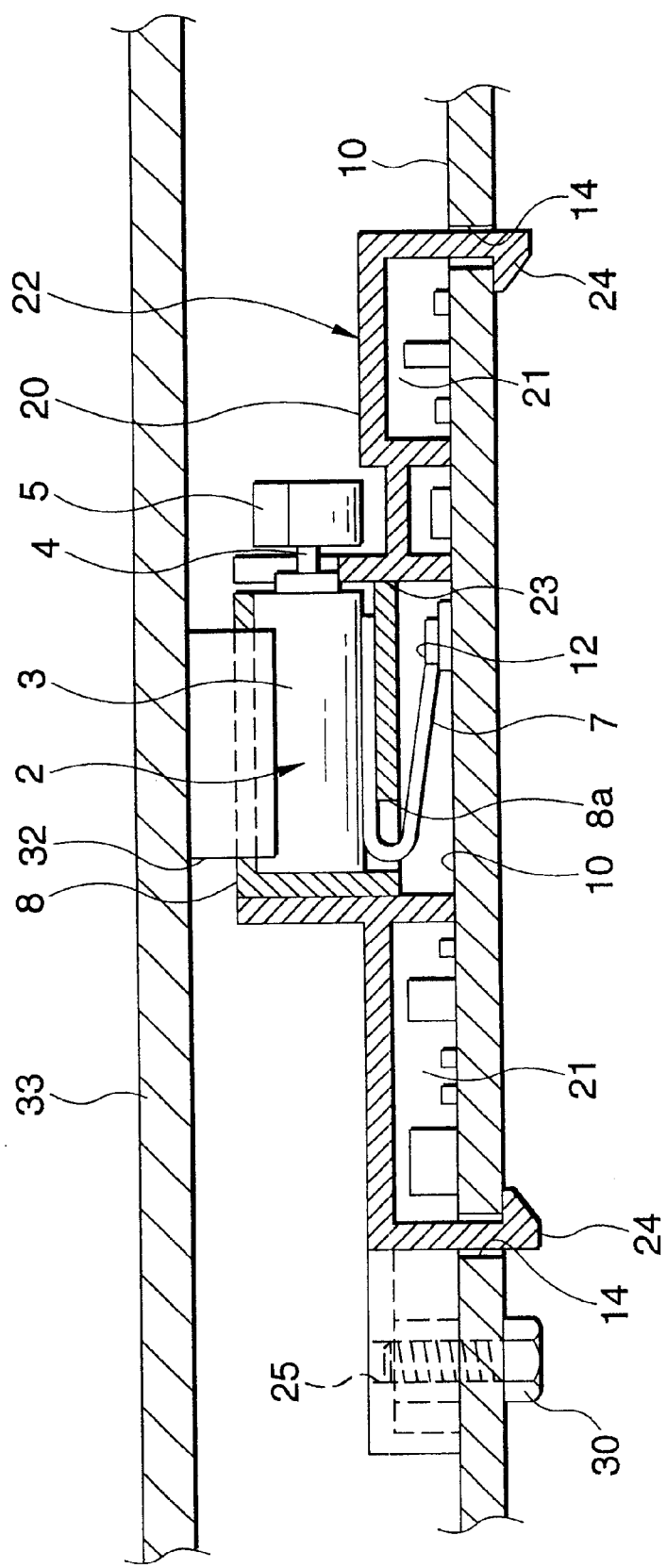
FIG. 2 is a sectional view showing a state where the vibrator holder according to this mode has been assembled, viewed from a side portion.
Figure 3A:
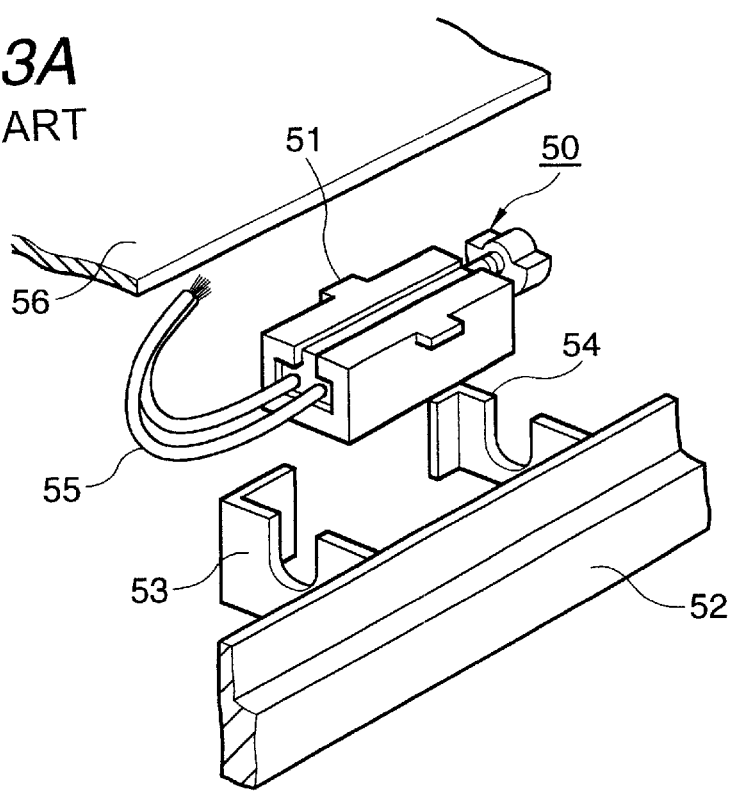
FIG. 3A is an exploded perspective view and FIG. 3B is a sectional view.
Figure 3B:
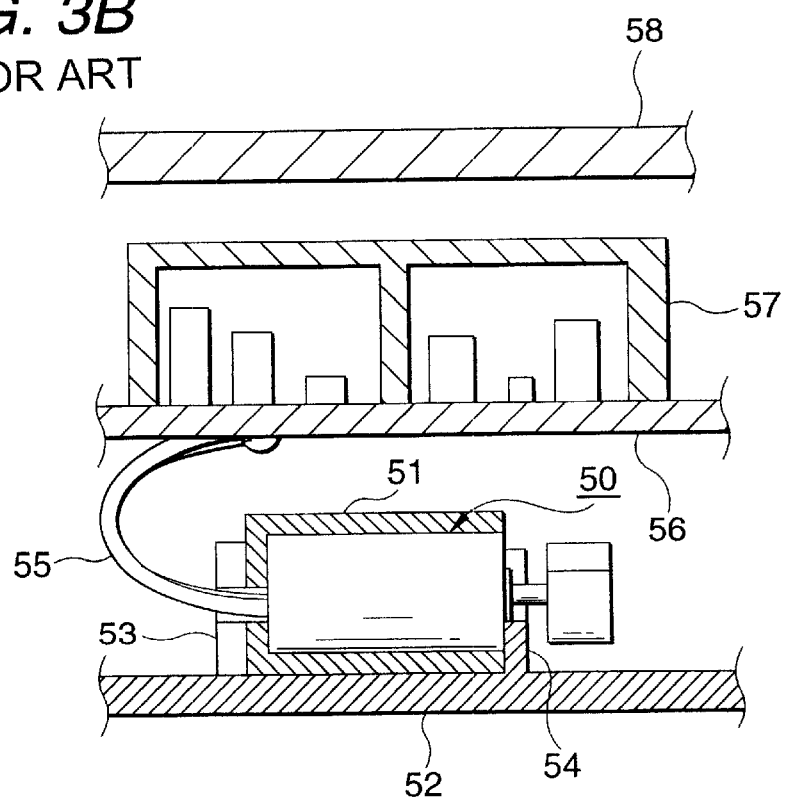
Figure 4A:
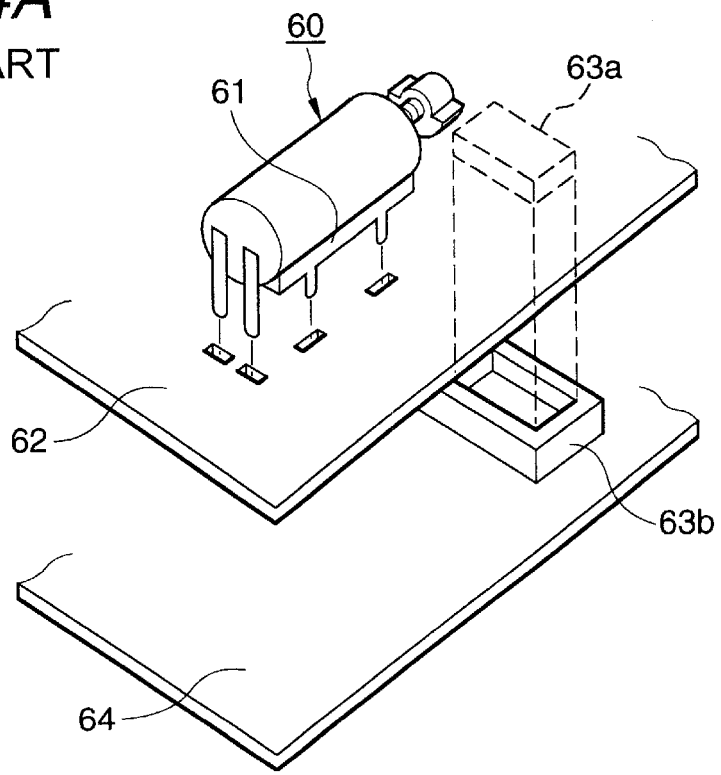
FIG. 4A is an exploded perspective view and FIG. 4B is a sectional view.
Figure 4B:
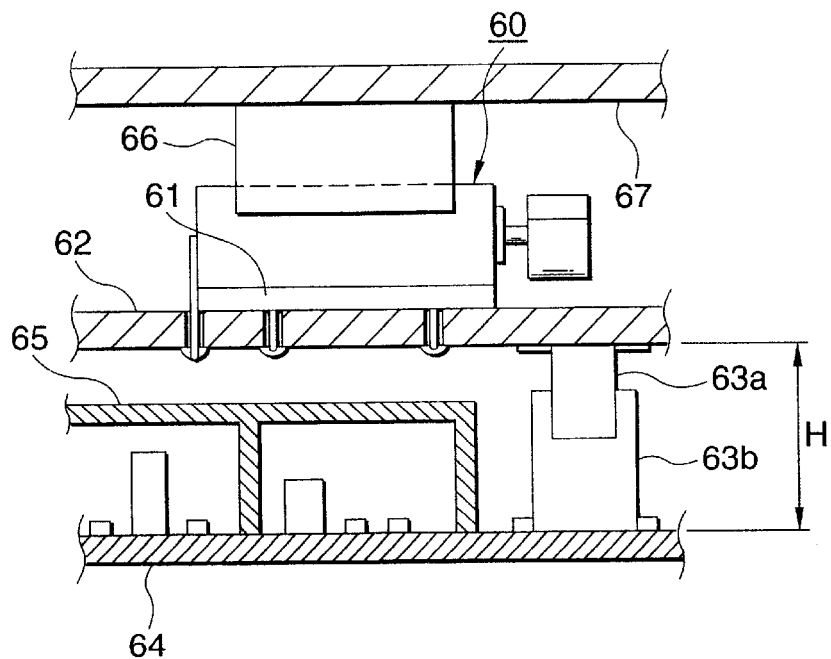

FIG. 1 is an exploded perspective view showing the constitution of a main portion of a communication terminal unit equipped with a vibrator holder according to one mode for carrying out the invention, and FIG. 2 is a sectional view showing a state where the vibrator holder shown in FIG. 1 has been assembled, viewed from a side portion. This mode shows a constitutional example in a small-sized communication terminal unit such as a pager, a portable telephone, or the like as an electronic device equipped with a vibrator.

As shown in FIG. 1, a communication terminal unit 1 has, as a vibrator holder, a vibrator attaching base 20 that attaches a vibrator 2 for vibrating a main body to a print circuit board 10 through a shock absorber 8. In the vibrator 2, an eccentric 5 is attached to a drive shaft 4 of a motor 3 and vibration is generated by rotating the eccentric 5 by the drive shaft 4. Further, the vibrator 2 is covered with the shock absorber 8 composed of an elastic and insulating member, whereby without transmitting the shock such as a fall directly to the vibrator 2, the shock is softened and a break can be prevented.

The vibrator attaching base 20 has at its lower portion a shield case 22 that is used also as a shield member on the print circuit board 10 and is a box-shaped base member. At the upper portion of this shield case 22, a holder 26 that is a holding member is integrally formed. By forcing the vibrator 2 covered with the shock absorber 8 into the holder 26 of the vibrator attaching base 20, the vibrator 2 is held; and by attaching the shield case 22 to the print circuit board 11, a plate spring-shaped terminal 7 projectingly provided for the vibrator 2 is brought into contact with a contact portion 12 of the print circuit board 10 thereby to conduct. Namely, the vibrator attaching base 20 is so constituted that it utilizes the shield member that is originally required on the circuit board and provides the holding member at the upper portion of the shield member. The vibrator attaching base 20 is formed, for example, by molding resin and evaporating aluminum on its surface.

The walls of the holder 26 is formed in the shape of a box opened upward in order to force the shock absorber 8 in which the vibrator 2 is stored into the holder so as to put the shock absorber 8 between their walls and in order to hold the vibrator forced into the holder in such a manner that the vibrator does not move up and down and left and right. On the other hand, the shield case 22 is formed in the shape of a box opened downward, and a through-hole 23 into which the plate spring-shaped terminal 7 of the vibrator 2 is inserted is formed in the bottom of the holder 26 in the center of the shield case. Further, at each sidewall of the shield case 22, fitting claws 24 are formed; and at both end portions of one side, female screw holes 25, 25 for screwing bolts 30 are formed. In this mode, the vibrator attaching base 20 is formed in the shape of the box, the unnecessary contact with a circuit on the print circuit board 10 is prevented utilizing this box-shaped vacancy 21 (refer to FIG. 2), and a shield effect is obtained.

The print circuit board 10 has the contact portion 12 with which the plate spring-shaped terminal 7 of the vibrator 2 comes into contact to conduct, the fitting holes 14 into which the fitting claws 24 . . . of the vibrator attaching base 20 are fitted are formed, and through-holes 16, 16 into which the bolts 30, 30 are inserted are formed.

Next, a procedure for assembling the vibrator attaching base 20 and the vibrator 2 in the print circuit board 10 will be described.

First, the vibrator 2 is covered with the shock absorber 8 and forced into the holder 26. Next, the fitting claws 24 are inserted into the fitting holes 14 of the print circuit board 10 thereby to be fitted into the holes, and the vibrator attaching base 20 is tightly attached to the print circuit board 10. Thereafter, the bolts 30, 30 are inserted into the through-holes 16, 16 to be screwed into the female screw holes 25, 25. Hereby, the working of attaching the vibrator 2 to the print circuit board 10 is completed. Lastly, this print circuit board 10 and the vibrator 2 are attached and fixed to the case 33 (refer to FIG. 2) of the communication terminal unit 1.

The structure of the vibrator holder that has been thus assembled is shown in FIG. 2. When the vibrator attaching base 20 and the vibrator 2 are assembled into the print circuit board 10, the plate spring-shaped terminal 7 of the vibrator 2 protrudes from a hole 8a of the shock absorber 8, comes into contact with the contact portion 12 of the print circuit board 10 through the through-hole 23 of the shield case 22, and conducts. Hereby, the drive electric power from the drive circuit provided on the print circuit board is supplied through the contact portion 12 and the plate spring-shaped terminal 7 to the vibrator 2.

Further, the shield case 22 of the vibrator attaching base 20 comes into contact with a ground pattern of the print circuit board 10 and conducts. By this constitution, the shield case 22 can be electrically connected to the print circuit board 10 without soldering the terminal of the vibrator 2, and the circuit of the print circuit board 10 can be reliably shield. Accordingly, at the maintenance time, without performing removal of the solder, the assembly and disassembly can be performed. At this time, the upper portion of the vibrator 2 is held by and fixed to the case 33 through a shock absorber 32.

In the vibrator holder of this mode, the holder 26 is formed in the shape of the box, the shock absorber 8 can forced into the holder so as to be put into the holder and held by the holder so as not to move up and down and right and left. For this reason, the vibrator 2 is prevented from falling off from the print circuit board 10 or hanging out of the print circuit board 10, so that causes to worsen the working efficiency are eliminated. Further, since the vibrator 2, the print circuit board 10 and the vibrator-attaching base 20 are formed integrally and used as a print circuit board unit, the assembly is facilitated. Further, the vibrator 2 can be attached to the vibrator-attaching base 20 with no gap, and the vibrator-attaching base 20 is used also as the shield member. Accordingly, the space necessary to attach the vibrator 2 is reduced, so that the device can be miniaturized.

Further, the vibrator 2 is attached to the vibrator attaching base 20 through the shock absorber 8 with no gap, and the vibrator attaching base 20 is fixed to the print circuit board 10 by the bolts 30, 30, whereby the vibration generating from the vibrator 2 is surely transmitted to the print circuit board 10. As this result, the vibration of the vibrator 2 can be surely transmitted to the case 33 of the communication terminal unit 1 through the print circuit board 10.

In the above-mentioned mode, the example in which the vibrator holder is applied to the communication terminal unit is described, however this vibrator holder can be similarly applied also to other electronic devices.

As described above, in this mode, in order to fix the vibrator covered with the shock absorber onto the print circuit board, the shield member that is originally required for the circuit of the electronic device is utilized. Therefore, since the vibrator can be directly attached to the shield member and mounted on the print circuit board, portability is good, and the assembly working and disassembly working of the vibrator can be facilitated.

Further, since the plate spring-shaped terminal provided for the vibrator is brought into contact with the contact portion of the print circuit board to conduct, when the disassembly for maintenance is performed, the disassembly and assembly can be readily performed without removing the solder, and the working efficiency is good. As this result, since the assembly working of the vibrator to the device body and the disassembly working of the vibrator from the device body can be performed without requiring much time and labor, maintenance efficiency can be improved.

Further, by utilizing the shield member in the vibrator-attaching base, the number of parts can be reduced, and the volume of the member itself and the space between the members can be reduced. Therefore, the arrangement space necessary to attach the vibrator can be made small. As this result, the device can be miniaturized, and when the device is designed, the freedom of the design can be heightened.

Further, the vibrator is attached to the integrally formed vibrator attaching base with no gaps and the vibrator attaching base is attached to the print circuit board thereby to form the integral print circuit board unit. Therefore, the vibration of the vibrator can be reliably transmitted to the case of the device through the print circuit board. Further, as the vibrator is covered with the shock absorber, even if it is fallen, the shock absorber absorbs the shock of a fall and the shock can be prevented from directly transmitting to the vibrator.

INDUSTRIAL APPLICABILITY

As described above, according to the invention, the vibrator attaching base in which the holding member for holding the vibrator and the base member are integrally formed is used; the vibrator is fitted into and attached to the holding member; the base member is attached to the circuit board to cause the terminal of the vibrator to conduct to the circuit board; and preferably, the base member is composed of the box-shaped member functioning also as the shield member required for the circuit board, whereby such effects are obtained that the working efficiency at the assembly time and the disassembly time is good, the required arrangement space is made small, and the device can be miniaturized.

What is claimed is:

1. A vibrator holder for holding a vibrator, which has an electrical terminal, relative to a circuit board with electronic components contained thereon, the holder including:

an integrally formed holding member and base member;

the holding member including means for receiving and holding the vibrator therein;

the base member including means for attaching the holder onto the circuit board, and a box-shaped portion providing gaps between the base member and the circuit board and shielding the circuit board and electronic components contained thereon when the holder is attached onto a circuit board, and the holding member and the base member including means configured to cooperate with the vibrator and the circuit board for causing the electrical terminal of the vibrator to be electrically connected to the circuit board during holding of the vibrator by the holding member and attachment of the base member to the circuit board.

2. The vibrator holder as set forth in claim 1, wherein at least the base member is made of resin material covered with a metal material.

3. The vibrator holder as set forth in claim 1, wherein the inner space of the box-shaped member forms the space between the base member and the circuit board.

4. The vibrator holder as set forth in claim 1, wherein the electrical terminal is a plate spring member projecting from the vibrator, the means configured to cooperate with the vibrator and the circuit board for causing the electrical terminal of the vibrator to be electrically connected to the circuit board includes a through hole for extension of the plate spring member through the holder and engagement with the circuit board.

5. A method of attaching a vibrator, having an electrical terminal, to a circuit board, having electronic components, the method including:

placing the vibrator in a holding member of a holder, which has an integrally formed holding member and base member, such that the vibrator is held therein;

locating the holding member at the circuit board including:

attaching attachment means of the base member onto the circuit board;

providing gaps between the base member and the circuit board by a box-shaped portion of the base member; and providing for shielding of the circuit board and electronic components contained thereon by the base member, and causing the electrical terminal of the vibrator to be electrically connected to the circuit board by the placement of the vibrator in the holding member and attaching the attachment means to the circuit board via a configuration of the holding member and the base member.

6. The method as set forth in claim 5, wherein the step of causing the electrical terminal of the vibrator to be electrically connected to the circuit board includes the use of a plate spring member as the electrical terminal of the vibrator and a contact portion is provided on the circuit board, with the contact portion coming into contact with and conducting to the terminal of the vibrator during the step of attaching attachment means of the base member onto the circuit board.

7. An electronic device including:

a circuit board with electronic components contained thereon;

a vibrator with an electrical terminal; and a holder for holding the vibrator relative to the circuit board, the holder including:

an integrally formed holding member and base member;

the holding member including means for receiving and holding the vibrator therein;

the base member including means for attaching the holder onto the circuit board, and a box-shaped portion configured for providing gaps between the base member and the circuit board and for shielding the circuit board and electronic components contained thereon when the holder is attached onto a circuit board, and the holding member and the base member including means configured to cooperate with the vibrator and the circuit board for causing the electrical terminal of the vibrator to be electrically connected to the circuit board during holding of the vibrator by the holding member and attachment of the base member to the circuit board.

8. A communication terminal unit including:

a circuit board with electronic components contained thereon for accomplishing a communication function;

a vibrator with an electrical terminal; and a holder for holding the vibrator relative to the circuit board, the holder including:

an integrally formed holding member and base member;

the holding member including means for receiving and holding the vibrator therein;

the base member including means for attaching the holder onto the circuit board, and a box-shaped portion configured for providing gaps between the base member and the circuit board and for shielding the circuit board and electronic components contained thereon when the holder is attached onto a circuit board, and the holding member and the base member including means configured to cooperate with the vibrator and the circuit board for causing the electrical terminal of the vibrator to be electrically connected to the circuit board during holding of the vibrator by the holding member and attachment of the base member to the circuit board.

* * * * *